US008552571B2

(12) United States Patent
Hosseini et al.

(10) Patent No.: US 8,552,571 B2
(45) Date of Patent: Oct. 8, 2013

(54) ELECTRONIC DEVICE AND METHOD FOR PRODUCTION

(75) Inventors: Khalil Hosseini, Weihmichl (DE); Matthias Stecher, Munich (DE)

(73) Assignee: Infineon Technologies AG, Neubiberg (DE)

(*) Notice: Subject to any disclaimer, the term of this patent is extended or adjusted under 35 U.S.C. 154(b) by 259 days.

(21) Appl. No.: 13/267,385

(22) Filed: Oct. 6, 2011

(65) Prior Publication Data

US 2012/0025384 A1    Feb. 2, 2012

Related U.S. Application Data

(62) Division of application No. 11/859,438, filed on Sep. 21, 2007, now Pat. No. 8,076,238.

(30) Foreign Application Priority Data

Sep. 22, 2006 (DE) .......................... 10 2006 044 691

(51) Int. Cl.
  *H01L 23/48*  (2006.01)
  *H01L 23/52*  (2006.01)
  *H01L 29/40*  (2006.01)

(52) U.S. Cl.
  USPC .......................................................... 257/784

(58) Field of Classification Search
  USPC .......................................................... 257/784
  See application file for complete search history.

(56) References Cited

U.S. PATENT DOCUMENTS

| 5,172,212 | A  | 12/1992 | Baba |
| 6,344,410 | B1 | 2/2002 | Lopatin et al. |
| 6,358,847 | B1 | 3/2002 | Li et al. |
| 6,693,020 | B2 | 2/2004 | Mui et al. |
| 6,727,593 | B2 | 4/2004 | Toyoda et al. |
| 6,818,545 | B2 | 11/2004 | Lee et al. |
| 6,825,564 | B2 | 11/2004 | Gleason et al. |
| 2001/0016408 | A1 | 8/2001 | Farnworth |
| 2002/0149118 | A1 | 10/2002 | Yamaguchi et al. |
| 2004/0159951 | A1 | 8/2004 | Toyoda et al. |
| 2005/0026413 | A1 | 2/2005 | Lee et al. |
| 2005/0067708 | A1 | 3/2005 | Burrell et al. |

FOREIGN PATENT DOCUMENTS

| EP | 0849797 | 6/1998 |
| EP | 1353365 | 10/2003 |
| JP | 01255234 | 10/1989 |
| JP | 09092649 | 4/1997 |
| JP | 2006120893 | 5/2006 |

OTHER PUBLICATIONS

Quirk, Michael and Julian Serda, Semiconductor Manufacturing Technology, Prentice Hall, p. 319, Nov. 2000.
Office Action mailed Nov. 2, 2010 in U.S. Appl. No. 11/859,438.
Final Office Action mailed Feb. 3, 2010 in U.S. Appl. No. 11/859,438.
Final Office Action mailed Feb. 18, 2011 in U.S. Appl. No. 11/859,438.

*Primary Examiner* — Jenny L Wagner
(74) *Attorney, Agent, or Firm* — Dicke, Billig & Czaja, PLLC (57) ABSTRACT

An electronic device and method for production is disclosed. One embodiment provides an integrated component having a first layer which is composed of copper or a copper alloy or which contains copper or a copper alloy, and having an electrically conductive second layer, whose material differs from the material of the first layer, and a connection apparatus which is arranged on the first layer and on the second layer.

14 Claims, 4 Drawing Sheets

ELECTRONIC DEVICE AND METHOD FOR PRODUCTION

CROSS-REFERENCE TO RELATED APPLICATIONS

This Utility Patent Application is a divisional application of U.S. application Ser. No. 11/859,438, filed Sep. 21, 2007, and claims priority to German Patent Application No. DE 10 2006 044 691.7 filed on Sep. 22, 2006, which is incorporated herein by reference.

BACKGROUND

The invention relates to an electronic device having an integrated component which, for example, contains a multiplicity of field-effect transistors and/or bipolar transistors.

In one embodiment, electronic parts are fitted in a multiplicity of technical appliances, for example, in mobile radios, video cameras, audio and video data players, and in motor-vehicle electronics. Motor-vehicle electronics make use of power parts, for example, of DMOS (double diffused metal-oxide semiconductor) circuits with, for example, more than half a million transistors connected in parallel for switching voltages of, for example, more than 20 volts or more than 60 volts, or for the switching of currents of more than 1 ampere or more than 10 amperes. External connections, which, for example, contain bonding wires or solder balls are subject to particular requirements, in one embodiment for power parts.

There is a need for a device of simple design. It should be possible to use the device for power applications, that is to say they can be correspondingly thermally-mechanically loaded. There is also a need for a method for producing a part.

For these and other reasons, there is a need for the present invention.

BRIEF DESCRIPTION OF THE DRAWINGS

The accompanying drawings are included to provide a further understanding of embodiments and are incorporated in and constitute a device of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a device hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

An electronic device is disclosed. In one embodiment, the electronic device includes:
- an integrated component having a first layer which is composed of copper or a copper alloy or which contains copper or a copper alloy, and having an electrically conductive second layer, whose material differs from the material of the first layer,
- a connection apparatus which is arranged on the first layer and on the second layer.

According to another embodiment, a device is specified having:
- an integrated component having a first layer which is composed of copper or a copper alloy or which contains copper or a copper alloy, and having a second layer, whose material differs from the material of the first layer,
- a connection apparatus which is arranged on the second layer or which is arranged on the second layer and on the first layer,
- the second layer is composed of or contains aluminum or an aluminum alloy, or the second layer is composed of or contains a metal from the fourth to sixth group in the periodic table, or the second layer is composed of or contains nickel and phosphorus.

The invention relates to a method for producing a device. In one embodiment, the method includes the following process:
- an integrated component is connected by pressing a connection apparatus through a second layer to a first layer, wherein the first layer is composed of copper or a copper alloy or contains copper or a copper alloy.

Another embodiment also relates to a method including the following processes:
- a first mask is applied to an integrated part,
- an electrically conductive inner area of a connecting apparatus is electroplated in a cutout in the first mask, wherein the inner area is composed of or contains copper or a copper alloy,
- after electroplating, a protective layer is deposited over the entire area, with the protective layer being composed of or containing aluminum or an aluminum alloy. Alternatively, the protective layer is composed of a metal of the fourth to sixth group in the periodic table, or contains such a metal.
- The protective layer is structured using a further mask, or the protective layer is structured by removing the first mask,
- or a second layer composed of a metal and phosphorus or containing a metal and phosphorus is selectively deposited using the first mask, instead of being deposited over the entire area and being structured.

One or more embodiments relate to an integrated circuit including a copper bonding wire which is bonded on copper and passes through a thin protective layer, which in one embodiment is electrically conductive, in order to reduce the contact resistance, if the thin protective layer remains in sub-areas between the bonding wire and the copper layer. In one embodiment, there is no via layer between the two layers, and the two layers have the same interconnect routing.

However, a layer sequence is also specified including the first layer (copper) and the second layer, in which a bonding wire is arranged only on the second layer. The layer sequence is in this case device of the uppermost metallization layer. In one embodiment, there is no via layer between the two layers, and the two layers have the same interconnect routing.

The first layer and the second layer can form a connecting conducting structure for an external connection of the integrated component. In one embodiment, the second layer forms a bonding pad, to which a bonding connection can be bonded. The layer thickness of the first layer, which is also referred to in the following text as the inner area, may be more than, for example, 3 micrometers or more than 5 micrometers. On the one hand, this makes it possible to ensure that high currents can be passed through the first layer. On the other hand, this thickness makes it possible to ensure that circuit parts of the integrated device which are located under the inner area will not be damaged during the bonding process.

The second layer makes it possible to ensure protection of the inner area, which is highly susceptible to environmental influences. In one embodiment, this makes it possible to prevent oxidation of copper.

The production of this device is based on the following considerations. By way of example, it could be possible to produce chip front-face metallizations composed of aluminum, that is to say the inner area would be composed of aluminum in a situation such as this. However, aluminum is less conductive than copper. The aluminum could therefore be replaced by a layer structure composed of different materials. For example, by a layer structure composed of a layer sequence of copper/nickel-phosphorus/palladium/gold, with the layers being applied in the stated sequence. A structure such as this could be produced in two main processes, specifically by electrochemical deposition of copper followed by non-electrical deposition of nickel-phosphorus, palladium and gold. Advantages of a layer structure such as this include:

- comparatively high temperatures could be used for the bonding of, for example, gold wires, for example, with a diameter in the range from 5 micrometers to 250 micrometers, for example, temperatures at the junction between the metals of more than 150° C.,
- this provides robustness against hot-spot problems, that is to say damage to the active structures located underneath caused by the bonding process,
- the lateral cell resistance is reduced,
- in comparison to aluminum pad metallization, this results in higher electromigration resistance, and
- adhesion promoters have a better growth, for example, an electrochemically applied adhesion promoter, in one embodiment zinc chromium oxide, which forms needles.

However, this layer structure would also have the following associated disadvantages or problems:

- high costs and long process times for the non-electrical deposition, and
- cracks in the nickel-phosphorus layer and/or in the nickel-phosphorus/palladium layer sequence resulting from heat-treatment processes after the rear-face metallization or in the test array by needle measurements or after wire bonding, particularly during aluminum wedge bonding, owing to the high forces during the bonding process and, if appropriate, higher ultrasound energy during the bonding process.

In high-power semiconductors, efforts are therefore being directed to an ever greater extent to the use of copper wires for making contact between the chip and a housing substrate, in order to reduce the electrical resistance of the housing. In optimized copper layer systems, that is to say in systems whose thickness or whose structure is optimized (metallization stacks including, for example, copper and hard layers such as nickel phosphorus), it is possible to bond copper wires, for example, with a diameter in the range from 15 micrometers to 500 micrometers, in one embodiment of more than 100 micrometers, or in the range from 25 micrometers to 150 micrometers, without any risk of crater formation during bonding to active structures, that is to say to semiconductor circuit elements. The copper could be oxidized by the high process temperatures during soldering of the die on the leadframe or to the module. Either the copper oxide should therefore be removed or the copper pad should be sealed such that it cannot be oxidized before the bonding process. Sealing can be achieved, for example, via a thin metal layer composed, for example, of aluminum.

The aluminum layer can be chosen to be sufficiently thin that, for example, the copper wire, the gold wire or the aluminum wire passes through the thin aluminum layer during the bonding process, so that it makes contact with the copper pad. This leads to better thermomechanical reliability, because the bonding wires composed of gold, aluminum or copper, or the alloys, can be connected to the first layer composed of copper or copper alloy, offering a reliable metallic system. Particularly in the case of copper on copper, the wire and the first layer or the inner area additionally have the same longitudinal thermal expansion as well, further improving the thermomechanical reliability.

A measure such as this could be used, for example, as an alternative or in addition to other measures in which, for example, the phosphorus content or the thickness of the nickel-phosphorus layer is deliberately influenced in order to reduce internal stresses in the nickel-phosphorus layer which result from mechanical loading, for example, in the test array or by wire bonds, or from thermal loads. However, the other measures would only reduce the risk of crack formation, but not eliminate it completely. For example, the probability of cracking increases as the nickel-phosphorus regions become larger. For example, the crack-formation probability is also as high as this because not only the entire covering surface but also the side surfaces of the connecting conducting structure could be passivated with nickel-phosphorus. Other measures such as these would also not allow mixed bonds, that is to say for example, copper-wire bonding with thick wires combined with aluminum ball bonding for small signal pads on the same device or on the same layer sequence. Aluminum alloys or some other material, for example, gold, could be used instead of aluminum.

A thin layer composed, for example, of aluminum material can be used as a coating for the copper pads, instead of non-electrical deposition of the nickel-phosphorus/palladium/gold layers on the copper pad. The aluminum coating, in one embodiment the thin aluminum coating, protects the copper pads against oxidation, which could occur as a result of the heat-treatment process of the chip rear-face metallization, during sawing, during the die-bonding process in the backend or at other points. Furthermore, the aluminum coating offers a surface for:

aluminum wedge bonding, and
gold-wire bonding.

Furthermore, an aluminum layer also allows bonding of copper wires. A thin aluminum layer would then preferably be used.

From the process point of view, the metallization process can be modified for this purpose in the backend of line. By way of example, after power copper has been applied electrochemically, aluminum in the form, for example, of aluminum silicon copper, aluminum copper or pure aluminum can, for example, be sputtered on, before the electroplating resist is removed. Other aluminum alloys can also be used in which case, for example, the alloy component may be less than 15 percent by atomic weight. The aluminum layer can then be structured using a wet-chemical process. For this purpose, a resist, for example, a lacquer, can be applied to the aluminum layer which, for example, has been sputtered on. Since, for manufacturing means, the resist for the second mask should not be passed over excessively high topography processes, the copper should, for example, be deposited up to the level of the electroplating resist. From the manufacturing point of view, this can be done easily. After aluminum structuring, both resist layers can then be removed, and the auxiliary layers for the electroplating of background metallization, that is to say for example, a copper barrier layer and, for example, a copper seed formation layer, can be removed by wet-chemical techniques, or in some other manner. The copper could also project slightly beyond the electroplating resist. In this case, the resist process would to a certain extent be covered for the aluminum sputtering process. However, this is not essential, especially if the pads are located in central areas of the covering surface, and not at its edge.

For example, the exposed copper side surfaces can be passivated with the aid of a polyimide, or by using a passivating manufacturing process such as the application of an adhesion promoter during chip assembly.

In one embodiment, the second layer or the protective layer is composed of a refractory metal, that is to say of a metal from the third to sixth group in the periodic table with a melting point which is higher than the melting point of platinum. The melting point of titanium is close to the melting point of platinum, so that this metal should be included here in the refractory metals. The refractory metals and their nitrides are particularly suitable for use as a protective layer. In one embodiment, well-proven production technologies already exist for the application of these metals and metal compounds. This refractory metal layer can be bonded through or may be thicker than 1 micrometer, so that it cannot be bonded through. Alternatively, it is also possible to use other materials which are applied electrochemically or are sputtered on.

Alternatively, the protective layer is composed of aluminum or an aluminum alloy, and a third layer or auxiliary layer is provided, which is adjacent to the protective layer and adjacent to the inner area. The refractory metals and refractory metal compounds that have been mentioned are likewise suitable as materials for the auxiliary layer. The thickness of the auxiliary layer may be in the range from 1 nanometer to 20 nanometers, or even in the range from 1 nanometer to 10 nanometers. The auxiliary layer is therefore thinner than typical barrier layers between aluminum and copper. This is permissible particularly if the barrier effect need be provided, for example, only until assembly, that is to say until bonding. After this, there is no disturbing effect if aluminum from the protective layer diffuses into the inner area of copper or copper alloy, thus canceling out the protective effect of the protective layer for the copper. This is because, for example, the device is already located in a passivating housing. The auxiliary layer may be in the form of a homogeneous layer or else a layer stack, for example, Ti/TiN/Ta/TaN.

In one embodiment, the first layer or the inner area may have a layer thickness of more than 3 micrometers, or more than 5 micrometers. This is typical in one embodiment for power components which, for example, switch switching currents of more than 0.5 amperes or more than 1 ampere, or even of more than 10 amperes.

The second layer or the protective layer may have a thickness in the range from 1 nanometer to 5 micrometers. If the protective layer is composed of aluminum or an aluminum alloy, the protective layer can therefore have a thickness in the range from 5 nanometers to 1 micrometer. The connecting apparatus can then be a bonding wire composed of aluminum or an aluminum alloy. Aluminum is therefore bonded to aluminum, resulting in a highly functionally reliable connection. Typical layer thicknesses of the protective layer in this case are, for example, in the range from 100 nanometers to 1 micrometer. The bonding wire contains an aluminum alloy, for example, with additives of nickel or magnesium, in order to harden the bonding wire. The alloy may have a proportion of less than 5% by atomic weight of the aluminum alloy. Alternatively, a bonding wire composed of copper or a copper alloy with more than 70% of atomic weight of copper is used.

Alternatively, the second layer or the protective layer may once again be composed of aluminum, with the thickness of the protective layer being in the range from 1 nanometer to 20 nanometers, or in the range from 1 nanometer to 200 nanometers. The connecting apparatus may then contain a bonding wire composed of copper or a copper alloy with, for example, more than 70% by atomic weight of copper. In this case, the protective layer is reliably passed through during the bonding process, so that the copper bonding wire is adjacent to the inner area composed of copper. Once again, this results in a highly functionally reliable bonding connection. In this case, typical thicknesses for the protective layer are, for example, 5 nanometers.

Furthermore, the first layer or the inner area may form a projection, with the protective layer having the same or a smaller lateral or side extent than the inner area. Alternatively, the protective layer can also be arranged to the side of the inner area, but with a layer thickness which decreases towards the foot area of the projection. These connecting apparatuses can be produced in one embodiment when the protective layer is sputtered onto a resist mask which surrounds the projection. The protective layer is, however, applied at the side of the inner area when there are gaps between the resist mask and the projection. In consequence, the connecting apparatus for the device is, for example, the result of a production process which will be explained in the following text, so that the advantages explained there also apply to the connecting apparatus and the part.

Furthermore, the second layer or the protective layer may be composed of or contain: nickel-phosphorus, cobalt tungsten phosphorus or nickel molybdenum phosphorus. These hard layers are then arranged only above the first layer, such that it is virtually impossible for any cracks to be formed in these layers during bonding or during probe card testing. This is contrary to the situation with an arrangement in which these layers are also arranged on the sides.

In one embodiment, a second protective layer can be arranged on the protective layer, for example, composed of palladium and/or a further protective layer composed, for example, of gold.

One embodiment relates to a method for producing a device including the following:

an integrated component is connected by pressing a connection apparatus in through a second layer to a first layer, wherein the first layer is preferably composed of copper or a copper alloy or contains copper or a copper alloy. The copper alloy contains, for example, more than 70% by atomic weight of copper.

The second layer is in one embodiment electrically conductive. Alternatively, however, the second layer is electrically insulating, particularly if it is possible to ensure that the connection apparatus can nevertheless be arranged with an adequately low contact resistance on the first layer.

In a method for producing a connecting apparatus, the following processes can be carried out:

a first mask is applied to an integrated component, an electrically conductive first layer or an inner area, in one embodiment a connecting apparatus, is electroplated in a cutout in the first mask, with the inner area once again being composed of copper or a copper alloy, a second layer or protective layer is deposited over the entire area after the electroplating, with the protective layer being composed in one embodiment of aluminum or an aluminum alloy, or with the protective layer being composed of a metal from the fourth to sixth group in the periodic table, or containing a metal alloy with these metals. Alternatively, the protective layer contains a metal-phosphorus alloy.

The protective layer is structured using a further mask, or the protective layer is structured by removing the first mask.

In one embodiment, a further mask is useful, especially when the first mask is still arranged on the device after the further mask has been applied. In this case, the surface is comparatively flat, because of the first mask, so that the second mask can be applied and structured easily. This applies in one embodiment to projecting inner areas with layer thicknesses of more than 3 micrometers or more than 5 micrometers, but less than, for example, 500 micrometers or 50 micrometers.

Alternatively, the protective layer is structured by removing the first mask, that is to say using a lift-off process. In this case, the use of a second mask, and thus the use of an expensive second lithographic process for structuring the protective layer, is avoided. Thick resist layers, such as those which are used to produce thick copper layers, assist the lift-off process.

The protective layer can be sputtered on. A wet-chemical process or else a dry-chemical process can be used for structuring the protective layer.

Furthermore and alternatively, the protective layer is applied selectively using the first mask. The use of a second mask is then optional, but ensures that the second layer or the protective layer can still cover relatively small surfaces.

In summary, in one embodiment, it is possible to provide copper pads with a structured aluminum coating. Once copper has been electrochemically deposited and the copper surface activated, it is possible, for example, for aluminum or an aluminum alloy to be vapor-deposited or sputtered in a structured form onto the copper metal, such that the aluminum covers the pad area. The aluminum, which is applied in a structured form, may, for example, be composed of aluminum (greater than 99.99% by atomic weight of aluminum) or an aluminum alloy with an alloy component of, for example, less than 5% by atomic weight, for example, Al1% Si, Al1% SiO0.5% Cu, AlO0.5% Cu. the layer thickness of the aluminum or of the aluminum alloy may, for example, be in the range from 1 nanometer to 5 micrometers. However, it is also possible to use pure aluminum. The typical aluminum thickness may, for example, be 5 nanometers or 1 micrometer, depending on whether the bonding wire is in fact intended to make contact with the copper inner area or with the aluminum protective layer.

In one embodiment, the pads may have any form, for example, a square or rectangular plan area.

The aluminum can also be replaced by appropriately thin TiN, Ti/TiN, Ta, Ta/TaN or other materials.

Multiple layer systems can also be used instead of the individual layers mentioned. One possible option would be, for example, Ta/TaN/AlCu.

The risk of nickel-phosphorus cracks can be reduced greatly by smaller regions. For example, it is thus possible to use a resist mask inverted with respect to the aluminum resist mask, in order to electroplate nickel-phosphorus, cobalt tungsten phosphorus or nickel molybdenum phosphorus. In this case, it will be possible to passivate only the pad regions with nickel-phosphorus etc.

Where the expression "can" is used in this application, this is intended to mean both the possibility and the actual implementation of the measure in an embodiment. A number of embodiments and exemplary embodiments of the invention will be described in the following text with reference to the figures, which are intended only for illustrative purposes and are not intended to restrict the scope of the invention.

Figure 1:
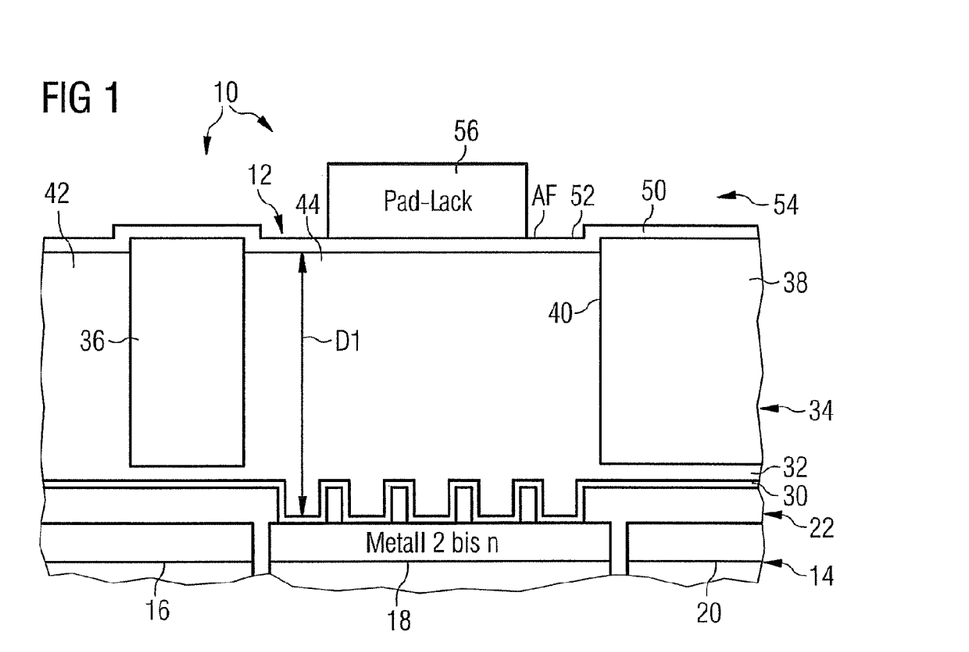
FIG. 1 illustrates a cross-sectional view through an integrated device during production.

FIG. 1 illustrates a cross section through an integrated device 10. The integrated device 10 is, for example, a power device which contains a multiplicity of parallel-connected semiconductor transistors. These transistors are not illustrated in FIG. 1 because they are located underneath the illustrated metallization in a semiconductor substrate, for example, in a silicon substrate or some other semiconductor substrate. The integrated device 10 contains a multiplicity of connecting apparatuses, see for example, the connecting apparatus 12.

After production of the transistors, a metallization layer or a plurality of metallization layers is or are applied, with FIG. 1 illustrating a second metallization layer 14 which contains interconnects 16 to 20 for lateral current transport. The electrically conductive interconnects 16, 18 and 20 are embedded in an isolating layer 22 composed of an electrically insulating material. In the exemplary embodiment, the isolating layer 22 overhangs the interconnects 16 to 20 and, above the interconnect 18, contains a multiplicity of vias or, alternatively, a multiplicity of elongated trenches. In another alternative, there is only one via, with a correspondingly large cross-sectional area, between the interconnect 18 and a copper projection 44.

After the structuring of the isolating layer 22, a barrier layer 30 was deposited, for example, by being sputtered on. By way of example, tantalum nitride or titanium nitride is suitable as the material for the barrier layer. Double layers are also used as a barrier layer 30. The thickness of the barrier layer 30 is, for example, less than 500 nanometers but, for example, is more than 10 nanometers. In one embodiment, the barrier layer 30 may be thicker than 300 nanometers.

A seed formation layer 32 was then sputtered onto the barrier layer 30, for example, a copper layer with a layer thickness in the range from 200 nanometers to 400 nanometers.

A resist mask 34 was then produced during the course of a photolithographic process, in one embodiment by application of an electroplating resist, for example, a resist based on imide. A resist such as this adheres very well to copper and can also be removed very well by wet-chemical techniques. The resist was then exposed and developed, with the resist mask 34 being created. The resist mask 34 contains resist areas 36 and 38 which, for example, surround a cutout 40. The resist layer for producing the resist mask 34 may, for example, be centrifuged or adhesively bonded on. Instead of a resist, it is also possible to use hard masks which, for example, are structured using a photoresist.

A copper projection 44 and further copper projections 42 etc. were then produced by using an electrochemical process with external current, with a layer thickness D1 of, for example, more than 10 micrometers. In the exemplary embodiment, the layer thickness D1 is 20 micrometers. The layer thickness D1 is normally less than 200 micrometers. Typical values for the layer thickness D1 are in the range from 7 micrometers to 40 micrometers.

In the exemplary embodiment, the copper projection 44 is produced with a layer thickness such that its covering area ends somewhat underneath the covering area of the resist mask 34, for example, only less than 5 micrometers under this covering area. In other alternatives, the projection 44 overhangs the resist mask 34. After electroplating, an aluminum layer 50 was sputtered on, in the exemplary embodiment with a layer thickness of 5 nanometers. Alternatively, the layer 50 has a thickness in the range from 3 to 200 nanometers, and may also be composed of a different material, for example, refractory metal.

A resist mask 54 was then applied in the course of a further photolithographic process, containing, for example, a resist area 56 above the projection 44. The resist mask 54 was also exposed and then developed. In the exemplary embodiment, the resist area 56 is located only in central areas of the projection 44 such that, for example, a circumferential edge area of the projection 44 is not covered by the resist area 56.

A process sequence has therefore been described in which aluminum forms a surface which can be bonded reliably on the pad, by virtue of the self-stopping oxidation characteristics of aluminum. The pattern-plating process takes place on the barrier layer 30, for example, a tungsten-titanium layer or a tantalum/tantalum nitride double layer. The barrier presents copper diffusion. Furthermore, the copper seed layer exists initially, with the thickness of typically 300 nanometers. The electroplating resist 38 was then structured, in general being intended to be thicker than the copper layer to be electroplated on it. Typical thicknesses are between 5 micrometers and 25 micrometers.

In the present process, the electroplating resist 38 was not removed after the electroplating process. The copper would be allowed to grow virtually to the same level as the electroplating resist, such that there would be no process or only a very small process at the edge of the cutout 40. However, this small process can, for example, also be covered by using an aluminum sputtering process.

After this, the aluminum, which is intended to prevent copper oxidation, and thus allows bonding with low forces, was structured by using a resist process, in one embodiment a standard resist process combined with, for example, wet-chemical etching.

Figure 2:
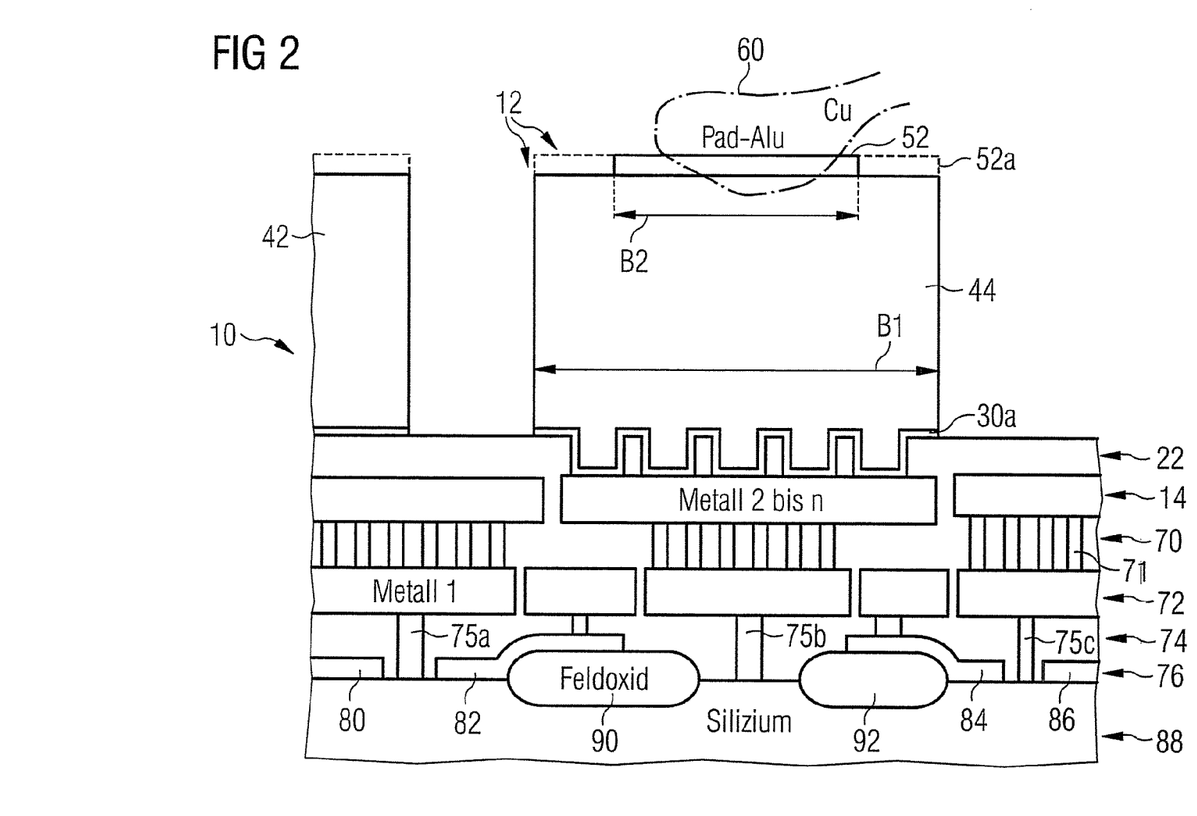
FIG. 2 illustrates a cross-sectional view through the device at a later stage during production.

As is illustrated in FIG. 2, the electroplating resist 38 and the aluminum resist 56 are then removed. The exposed areas of the copper seed formation layer 32 and the barrier layer 30 located underneath it are then removed. As can be seen in FIG. 2, the copper projection 44 has a width B1 at its foot area which is broader than the width B2 of the remaining aluminum layer area 52. For example, the width B2 has a value of 150 micrometers. The width B2 is typically in the range between 50 micrometers and 200 micrometers. For wedge bonding connections, the width B2 may also have values up to 1 millimeter.

As is illustrated in FIG. 2, a bonding wire 60 is applied or bonded on, is composed, for example, of copper or a copper alloy, and passes through the thin aluminum layer 52. Alternatively, copper balls are bonded through the aluminum layer 52.

FIG. 2 also illustrates a variant in which an aluminum layer area 52a has a width which corresponds to the width B1 of the copper projection 44. In this case, for example, the aluminum layer 52 is structured using a lift-off process, in which the electroplating resist 38 is lifted off with the aid of an adhesive tape, with the aid of pincers or the like, with the aluminum layer 52 being torn off on edges of the copper projection 44. The process of tearing off and structuring can be assisted by the use of the process at the edge of the cutout 40.

FIG. 2 also illustrates deeper areas of the integrated device 10, in one embodiment:

an isolating layer 70 under the metallization layer 14, with a multiplicity of vias being arranged in the isolating layer 70, for example, the via 71.

a first metallization layer 72 which is arranged under the isolating layer 70 and contains a multiplicity of interconnects, an isolating layer 74 in which a multiplicity of contacts are located which lead directly to semiconductor areas, see for example, the contacts 75a, 75b and 75c, with 75a and 75c preferably being source connections and 75b a gate connection of a switching transistor.

a polysilicon layer 76 which is arranged under the isolating layer 74 and has a multiplicity of polysilicon areas 80 to 86. By way of example, the polysilicon areas 80 to 86 form gate electrodes of field-effect transistors, with the gate electrodes being isolated from a silicon substrate 88 by a thin dielectric (not illustrated), and the silicon substrate 88, which alternatively may also be composed of a different semiconductor material. By way of example, field-oxide areas 90, 92 are arranged on the covering surface of the silicon substrate 88. Alternatively, flat isolating trenches are used, in order to isolate components from one another.

By way of example, the drain connection can also be located on the rear face of the silicon substrate.

Figure 3:
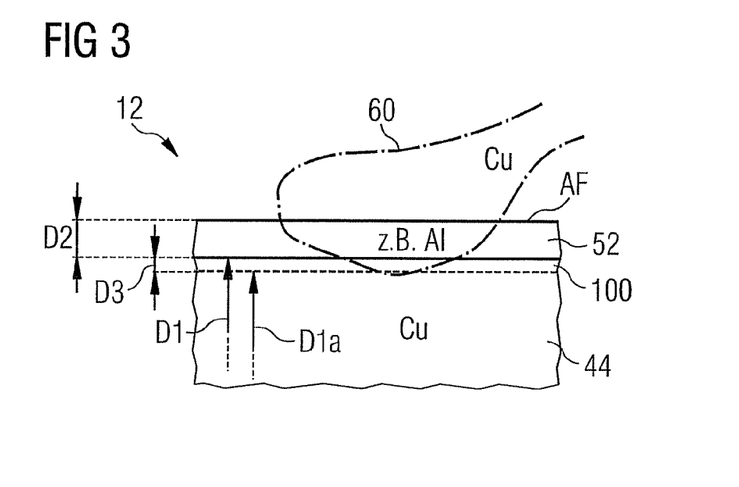
FIG. 3 illustrates a further cross-sectional view through the integrated part.

FIG. 3 illustrates an enlarged illustration of the connecting apparatus 12. The figure illustrates a thickness D2 of the aluminum layer 52, on which the connecting surface AF is located, through which the bonding wire 60 passes. Optionally, an auxiliary layer 100 is arranged between the aluminum layer 52 and the copper projection 44 and contains a material which forms a diffusion barrier, which prevents the aluminum in the aluminum layer 52 from diffusing into the copper projection 44, in one embodiment in a time between the production of the copper projection 44 and the application of the bonding wire 60. The copper bonding wire in one embodiment also passes through the auxiliary layer 100, to increase the electrical conductivity of the connection. However, this is not essential. Suitable materials for the auxiliary layer 100 are, for example, titanium nitride or tantalum nitride. The layer thickness D3 of the optional auxiliary layer 100 in the exemplary embodiment is less than 20 nanometers and is, for example, 10 nanometers. When using the auxiliary layer 100 as well, the copper projection 44 has a thickness D1a which corresponds to the thickness D1. The thickness of the auxiliary layer 100 is annotated D3 in FIG. 3. The bonding wire 60 also passes through the auxiliary layer 100, so that copper is bonded to copper. Alternatively, the bonding wire 60 does not pass through the auxiliary layer 100 but only the aluminum layer 52, or a layer 52 composed of some other material that has been mentioned, such as a refractory metal.

Figure 4:
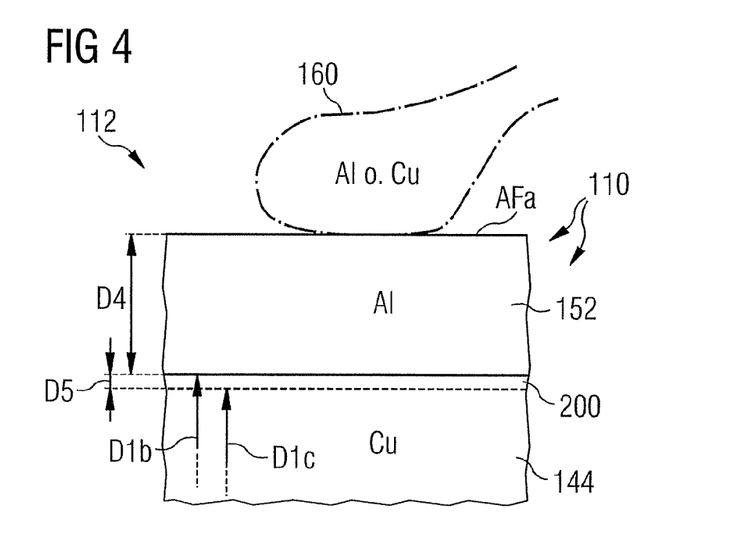
FIG. 4 illustrates a cross-sectional view through an integrated device according to a second embodiment.

FIG. 4 illustrates a copper projection 144 which is produced in the same way as the copper projection 44 and has a thickness D1b which corresponds to the thickness D1. With the electroplating resist mask still present, an aluminum layer 152 with a thickness D4 is sputtered onto the copper projection 144, with the thickness D4 being, for example, 1 micrometer, and normally being in the region of 0.5 micrometer or 2 micrometers. The aluminum layer 152 was structured with the aid of a further photolithographic process, for example, using a dry-chemical or wet-chemical etching process to structure the aluminum layer 152. A connecting area AFa on the upper face of the aluminum layer 152 is used for connection of a bonding wire 160 composed of aluminum or an aluminum alloy (very good thermomechanical behavior, since aluminum on aluminum) or of copper or a copper alloy. The bonding wire 160, the aluminum layer 152 and the copper projection 144 form a connecting structure 112.

In another exemplary embodiment, a barrier layer 200 is also arranged between the copper projection 144 and the aluminum layer 152 and has a thickness D5 in the range from 1 nanometer to 20 nanometers. For example, the barrier layer 200 contains a material which is a diffusion barrier against the diffusion of copper, or against the diffusion of aluminum. By way of example, the auxiliary layer 200 is composed of titanium nitride or tantalum nitride. The copper projection 144 also has a thickness D1c, which corresponds to the thickness D1b, when the auxiliary layer 200 is used.

Figure 5:
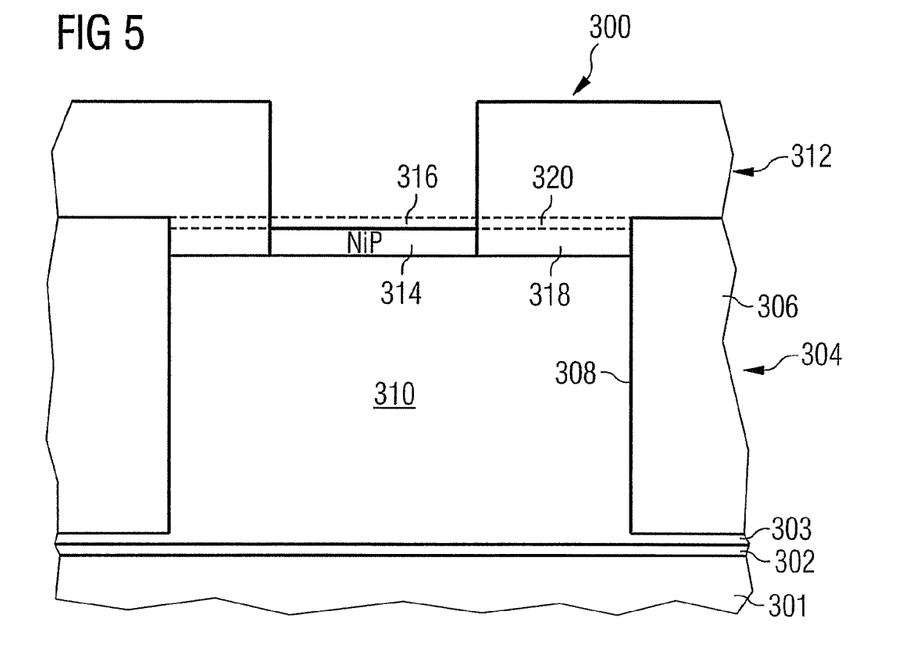
FIG. 5 illustrates an exemplary embodiment with a nickel-phosphorus layer.

FIG. 5 illustrates an exemplary embodiment with a nickel-phosphorus layer 314, 318 in an integrated component 300. FIG. 5 illustrates a metallization layer 301 on the integrated component 300. Reference should be made to FIGS. 1 and 2, for example, with regard to the layers under the metallization layer 301. By way of example, the metallization layer 301 is manufactured using the copper Damascas technique, for example, by using a dual or single Damascas technique. A barrier layer 302 was applied over the entire area to the metallization layer 301, with a material composition and thickness corresponding to those of the barrier layer 31.

A copper seed formation layer or seed layer 303 was then applied to the barrier layer 302, whose material composition and thickness correspond to those of the seed formation layer 32. A layer to produce the resist mask 304, for example, composed of photoresist, was then applied, for example, corresponding to the resist mask 34. By way of example, the thickness of the layer or resist mask 304 is greater than 10 micrometers and, in the exemplary embodiment, is 20 micrometers. This layer thickness can be achieved, for example, by a multiple resist layer. However, resists also exist which can be centrifuged on with a coating thickness of up to 200 micrometers in each case. The resist mask was produced by a photolithographic process from the layer, resulting in a resist area 306. The resist area 306 surrounds a cutout 308.

A copper area 310 is then produced in the cutout 308, using external current, in an electrochemical process. By way of example, the thickness of the copper area 310 is somewhat less than the thickness of the resist area 306. Alternatively, the copper area 310 ends with the opening of the cutout 308, or even overhangs it somewhat.

In a first variant, a nickel-phosphorus layer 318 is applied, preferably without external current (electroless), with the resist mask 304 still present. The thickness of the nickel-phosphorus layer 318 is, for example, 0.5 micrometers. The thickness of the nickel-phosphorus layer 318 is, for example, in the range from 200 nanometers to 5 micrometers, or even up to 50 micrometers. Because the layer 318 is not located on the side walls of the copper area 310, it is less susceptible to cracking than with such side walls. In the first variant, a further protective layer 320 can also optionally be applied, for example, using the mask 306. The protective layer 320 is, for example, a gold layer or a palladium/gold layer, with the palladium or gold layer in each case having a thickness of only a few nanometers, that is to say flash coating with layer thicknesses of, for example, less than 100 nanometers. In the first variant, the resist mask is then removed, with the coating of the copper area 310 being complete. During the subsequent bonding process, no copper bonding wire passes through the nickel-phosphorus layer. In another embodiment, an aluminum wire or, for example, a gold wire is used instead of the copper bonding wire. Mixed bonds are also used for an integrated circuit 300.

In a second variant, once the nickel-phosphorus layer 318 and, if appropriate, the protective layer 316 has or have been applied, a resist mask is applied which corresponds to the resist mask 54 that is not illustrated in FIG. 5, however. This resist mask is applied with the resist mask 304 still present, in order to allow structuring. After structuring, a nickel-phosphorus layer 314 is produced from the nickel-phosphorus layer 318, and/or a protective layer 316 is produced from the protective layer 320, covering a smaller area, by using a wet-chemical or dry-chemical etching process, thus further reducing the risk of the nickel-phosphorus layer 314 cracking. This completes the coating of the copper area 310, following which the component 300 can be bonded and surrounded by a housing body, see variant one.

In a third variant, after the electroplating of the copper area 310 but still before the application of the nickel-phosphorus layer, a layer for a resist mask 312 is applied to the resist mask 304 and to the copper area 310 as well. This resist layer, for example, composed of photoresist, is structured, with only a central area of the covering surface of the copper area 310 still being exposed, see FIG. 5. The resist mask 312 can be structured well, since it is located on a comparatively flat surface, which is achieved by the resist mask 304. The nickel-phosphorus layer 314 is then applied into the opening in the resist mask 312, preferably electrochemically or without external current, that is to say electroless. The protective layer 316 or the protective layers 316 is or are applied optionally. Both the resist masks 304 and 312 are then removed, and the barrier layer 302 and the seed formation layer 303 between copper projections are removed. The bonding process can then be carried out as in the first variant.

Figure 6:
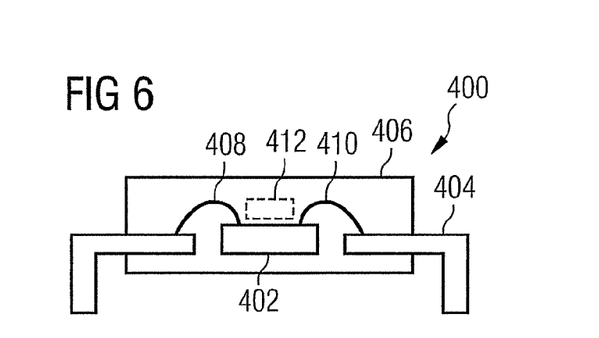
FIG. 6 illustrates an exemplary embodiment for a device provided with a housing.

FIG. 6 illustrates an exemplary embodiment for an electronic device 400 provided with a housing. The device 400 contains a chip 402, for example, the integrated component 10 or 110. The device 400 also contains a multiplicity of connecting legs, see for example, the connecting leg 404. The connecting legs 404 were, for example, stamped out from a leadframe.

The device 400 also contains a housing body 406, for example, composed of a stamped component, for example, a polymer material. The chip 402 is connected to the connecting legs 404 via bonding wires 408, 410, for example. The bonding wires 408, 410 correspond to the respective bonding wires 60 and 160. In addition, the device 400 in one alternative embodiment may also contain a chip 412 which is arranged on the chip 402, for example, using flip-chip technology. Not only bonding wires but also soldered connections are therefore connected to the connecting conducting structures that have been explained. Alternatively, for example, copper balls are bonded onto the chip 402 instead of the soldered connections. In this case, by way of example, the chip 412 is soldered to the copper balls.

Figure 7:
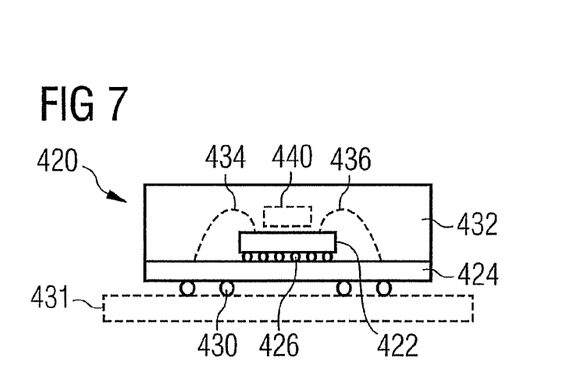
FIG. 7 illustrates a further exemplary embodiment for a device provided with a housing.

FIG. 7 illustrates a further exemplary embodiment of an electronic device 420 provided with a housing. The device 420 contains a chip 422 which, for example, is constructed in the same way as the integrated components 10, 110 which have been explained with reference to FIGS. 1 to 4. Furthermore, the device 420 contains an interposer 424, in one embodiment a printed circuit board, for example, composed of FR4 (flame retardant type 4), FR5 or BT material, a ceramic plate or an interposer 424 produced using thin-film technology on a housing body 432. Connections 426 connect the chip 422 to the interposer. By way of example, the connections 426 are solder balls.

By way of example, solder balls 430 connect the device 420 to a printed circuit board 431 which, for example, is fitted with further parts, in one embodiment including passive parts, such as coils and capacitors.

The device 420 contains a housing body 432 composed, for example, of the same material as the housing body 406. Optionally or as an alternative to the connections 426, there are, for example, bonding wires 434, 436, which correspond to the respective bonding wires 60 and 160, between the chip 422 and the interposer 424. There is optionally also another chip 440 in the device 420.

The methods mentioned can also be carried out using different materials for the layer 50, 152 through which the bonding passes, for example, palladium-nickel, nickel-phosphorus or the like.

Wire bonding through a thin protective layer can be carried out by wedge bonding, ball bonding or stitch bonding (a bonding wire bent sideways is pressed against a connecting platelet or connecting pin), in one embodiment with copper being bonded on copper through the protective layer. In the case of wire bonding types such as these, the bonding connections for a device are produced successively, in one embodiment at temperatures below 400° C. Ultrasound is optionally used for the bonding process, which makes it possible to use temperatures below 150° C.

The chips 412 and 440 are mounted using flip-chip technology, in which case, for example, contact projections also pass through a thin protective layer to connecting sublayers, connecting pads or to mating contact projections. The contact projections and mating contact projections are, for example, cylindrical, spherical or the like. The bonding may also pass through two protective layers, one of which is arranged at the connection of the respective chip 402 or 422, and the other is arranged at the connection of the respective chip 412 or 440. Any of the material combinations mentioned above may be used as materials for the contact projections and protective layers, in one embodiment copper with a thin aluminum protective layer etc. In this technique, all the connections are produced at the same time, and therefore very quickly.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device, comprising:
   an integrated component having a first layer which is composed of copper or a copper alloy or which contains copper or a copper alloy, and having an electrically conductive second layer, whose material differs from the first layer; and
   a connection apparatus which is arranged on the first layer and on the second layer,
   wherein the connection apparatus passes through the second layer and directly contacts the first layer.

2. The device of claim 1, comprising:
   wherein the connection apparatus is composed of copper or a copper alloy or contains copper or a copper alloy,
   or wherein the connection apparatus is composed of aluminum or an aluminum alloy, or contains aluminum or an aluminum alloy,
   or wherein the connection apparatus is composed of gold or a gold alloy, or contains gold or a gold alloy.

3. The device of claim 1, wherein the connection apparatus is arranged outside the integrated component.

4. The device of claim 1, wherein the second layer is arranged on the first layer.

5. The device of claim 1, wherein the second layer is composed of or contains aluminum or an aluminum alloy, or the second layer is composed of or contains a metal from the fourth to sixth group in the periodic table, or the second layer is composed of metal and phosphorus, or contains metal and phosphorus.

6. The device of claim 5, comprising:
   wherein the second layer is composed of or contains aluminum or an aluminum alloy,
   wherein the thickness of the second layer is in the range from 5 nanometers to 1 nanometer, or is in the range from 90 nanometers to 1 micrometer or 2 micrometers,
   and wherein the connection apparatus is a bonding wire, composed of aluminum or an aluminum alloy, which contains more than 70 percent by atomic weight of aluminum, or is composed of copper or a copper alloy, which contains at least 70 percent by atomic weight of copper.

7. The device of claim 1, comprising wherein the second layer is composed of or contains:
   titanium, or
   titanium nitride, or
   a double layer comprising a titanium layer and a titanium nitride layer, wherein the titanium layer is arranged closer to the first layer than the titanium nitride layer, or
   tantalum, or
   tantalum nitride, or
   a double layer comprising a tantalum layer and a tantalum nitride layer, wherein the tantalum layer is arranged closer to the first layer than the tantalum nitride layer, or
   tungsten, or
   a double layer comprising a tungsten layer and a titanium layer, wherein the tungsten layer is arranged closer to the first layer than the titanium layer.

8. The device of claim 1, wherein the second layer is composed of or contains aluminum or an aluminum alloy, with more than 70 percent by atomic weight of aluminum; and
   wherein an electrically conductive third layer is arranged between the second layer and the first layer and is composed of or contains:
   titanium, or
   titanium nitride, or
   a double layer comprising a titanium layer and a titanium nitride layer, wherein the titanium layer is arranged closer to the first layer than the titanium nitride layer, or
   tantalum, or
   tantalum nitride, or
   a double layer comprising a tantalum layer and a tantalum nitride layer, wherein the tantalum layer is arranged closer to the first layer than the tantalum nitride layer, or tungsten, or a double layer comprising a tungsten layer and a titanium layer, wherein the tungsten layer is arranged closer to the first layer than the titanium layer.

9. The device of claim 1, wherein the second layer has the same lateral extent as the first layer.

10. The device of claim 1, wherein the connection apparatus contains a small contact between two integrated components, which are arranged in a component stack.

11. An electronic device, comprising:
   an integrated component having a first layer comprising copper, and having a second layer comprising aluminum directly contacting the first layer, the second layer consisting of a planar layer; and
   a connection apparatus which is arranged on the first layer and on the second layer,
   wherein the connection apparatus passes through the second layer and directly contacts the first layer.

12. The electronic device of claim 11, further comprising:
   an isolating layer comprising a via or trench extending through the isolating layer;
   wherein the first layer is arranged on the isolating layer and extends into the via or trench.

13. The electronic device of claim 11, wherein sidewalls of the first layer directly contact a housing body comprising a polymer material.

14. The electronic device of claim 11, further comprising:
   a metallization layer electrically coupled to the first layer via a barrier layer.

\* \* \* \* \*